(12) United States Patent
Goyal et al.

(10) Patent No.: US 12,352,780 B2
(45) Date of Patent: Jul. 8, 2025

(54) INTEGRATED CIRCUIT TEST SOCKET WITH INTEGRATED DEVICE PICKING MECHANISM

(71) Applicant: Western Digital Technologies, Inc., San Jose, CA (US)

(72) Inventors: Yalaj Goyal, Indore (IN); Shailesh R. Nayak, Bangalore (IN); Joe Paul Moolanmoozha, Bangalore (IN)

(73) Assignee: Sandisk Technologies, Inc., Milpitas, CA (US)

( * ) Notice: Subject to any disclaimer, the term of this patent is extended or adjusted under 35 U.S.C. 154(b) by 0 days.

(21) Appl. No.: 17/850,858

(22) Filed: Jun. 27, 2022

(65) Prior Publication Data
US 2023/0417796 A1    Dec. 28, 2023

(51) Int. Cl.
*G01R 1/04*   (2006.01)
*G01R 31/28*   (2006.01)

(52) U.S. Cl.
CPC ....... *G01R 1/0466* (2013.01); *G01R 31/2893* (2013.01)

(58) Field of Classification Search
CPC ............ G01R 1/0466; G01R 31/2893
See application file for complete search history.

(56) References Cited

U.S. PATENT DOCUMENTS

| 5,290,134 A | 3/1994 | Baba |
| 5,504,436 A * | 4/1996 | Okutsu ............... G01R 1/0433 439/264 |
| 5,708,222 A * | 1/1998 | Yonezawa .......... G01R 31/2887 414/941 |
| 6,416,332 B1 | 7/2002 | Carron et al. |
| 6,628,128 B1 * | 9/2003 | Farnworth ............. H05K 1/112 324/756.02 |
| 7,108,535 B1 | 9/2006 | Mingviriya |
| 10,502,775 B2 | 12/2019 | Liao et al. |
| 2002/0047720 A1 * | 4/2002 | Farnworth ........... G01R 1/0483 324/750.16 |
| 2005/0225346 A1 * | 10/2005 | Saito .................. G01R 31/2877 324/757.01 |

(Continued)

FOREIGN PATENT DOCUMENTS

| CN | 106067438 A | 11/2016 |
| JP | H0343179 A * | 2/1991 |

(Continued)

OTHER PUBLICATIONS

Translation of KR101420185B1 (Year: 2014).*

(Continued)

*Primary Examiner* — Paresh Patel
(74) *Attorney, Agent, or Firm* — LOZA & LOZA, LLP; Gabriel Fitch

(57) ABSTRACT

An integrated circuit (IC) device test socket has an integrally formed IC picking mechanism for removing an IC device from the test socket after testing. The test socket has a base member and a cover member. The base member includes a recess that is configured to receive an IC device for testing. The cover member is configured to removably engage the base member to secure the IC device between the cover member and the base member. The cover member includes an IC picking mechanism configured to use suction to retain the IC device to the cover member.

14 Claims, 9 Drawing Sheets

(56) References Cited

U.S. PATENT DOCUMENTS

2008/0074118 A1    3/2008  Masuo
2012/0252243 A1*  10/2012  Chan .................... G01R 1/0458
                                                    439/310
2015/0260793 A1*   9/2015  Chen .................. G01R 31/2863
                                                    324/756.01

FOREIGN PATENT DOCUMENTS

JP      2002098251 A  *  4/2002
TW       202016549 A  *  5/2020

OTHER PUBLICATIONS

Translation of JP 2019113471 (Year: 2019).*
Translation of KR 100368898 B1 (Year: 2003).*
Translation of KR 100276826 B1 (Year: 2001).*
Translation of KR 950033507 A (Year: 1995).*

* cited by examiner

INTEGRATED CIRCUIT TEST SOCKET WITH INTEGRATED DEVICE PICKING MECHANISM

FIELD

The disclosure relates, in some aspects, to integrated circuit (IC) test sockets, and more particularly relates to an IC test socket with an integrated IC picking mechanism.

INTRODUCTION

Integrated circuits (ICs) manufactured today can use various IC packages including through-hole and surface-mounted packages. One example of a surface-mounted package is the ball grid array package (BGA). A packaged IC device can be tested using an IC test socket that provides the mechanical and electrical connections between the IC device (Device Under Test (DUT)) and a testing apparatus (e.g., an IC testing circuit board or the like). The IC test socket provides a convenient way to test and validate an IC device without soldering the IC device to the circuit board. Therefore, the same circuit board equipped with the IC test socket can be used to test multiple IC devices successively.

SUMMARY

The following presents a simplified summary of some aspects of the disclosure to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present various concepts of some aspects of the disclosure in a simplified form as a prelude to the more detailed description that is presented later.

Various aspects of the disclosure provides an integrated circuit (IC) device test socket with an integrally formed IC picking mechanism for picking and removing an IC device from the test socket after testing.

In one embodiment, an IC test socket includes a base member including a recess configured to receive an IC device for testing. The IC test socket further includes a cover member configured to removably engage the base member to secure the IC device between the cover member and the base member. The cover member includes an IC picking mechanism integrally formed in the cover member. The IC picking mechanism is configured to apply, in a first position, a suction to retain the IC device to the cover member. The IC picking mechanism is configured to release, in a second position, the IC device from the cover member.

In one embodiment, an IC test socket includes a base member for holding an IC device to be tested therein. The IC test socket further includes a cover member configured to removably engage the base member to secure the IC device between the cover member and the base member. The cover member includes a through-aperture formed between a first surface of the cover member and a second surface of the cover member. The cover member further includes a plunger movable in the through-aperture to change an atmospheric pressure inside the through-aperture to control a suction that retains the IC device to the cover member.

In one embodiment, a method of handling an IC device under test, includes positioning an IC device in a test socket including a base member and a cover member configured to removably engage the base member to secure the IC device between the cover member and the base member during testing. The method further includes operating an IC picking mechanism integrally formed in the cover member to generate a suction that holds the IC device to the cover member. The method further includes removing the IC device from the base member by separating the cover member from the base member with the IC device attached to the cover member by the suction.

In one embodiment, a method of handling an IC device under test, includes positioning an IC device in a test socket including a base member and a cover member configured to removably engage the base member to secure the IC device between the cover member and the base member during testing. The method further includes separating the cover member from the base member with the IC device. The method further includes operating an IC picking mechanism integrally formed in the cover member to dislodge the IC device from the cover member.

DETAILED DESCRIPTION

In the following detailed description, reference is made to the accompanying drawings, which form a part thereof. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

The examples herein relate to an integrated circuit (IC) test socket with an integrated IC picking mechanism and methods for handling and testing an IC device using the IC test socket. An IC device includes an integrated circuit die packaged or encased in one of various available IC packages. Some examples of IC packages include a double in-line package (DIP), a small outline (SO) package, a ball grid array (BGA) package, etc. In this disclosure, an IC device can be referred to as an IC chip, a chip, or simply an IC. An IC test socket can be used to test multiple IC devices successively.

Overview

Figure 1:
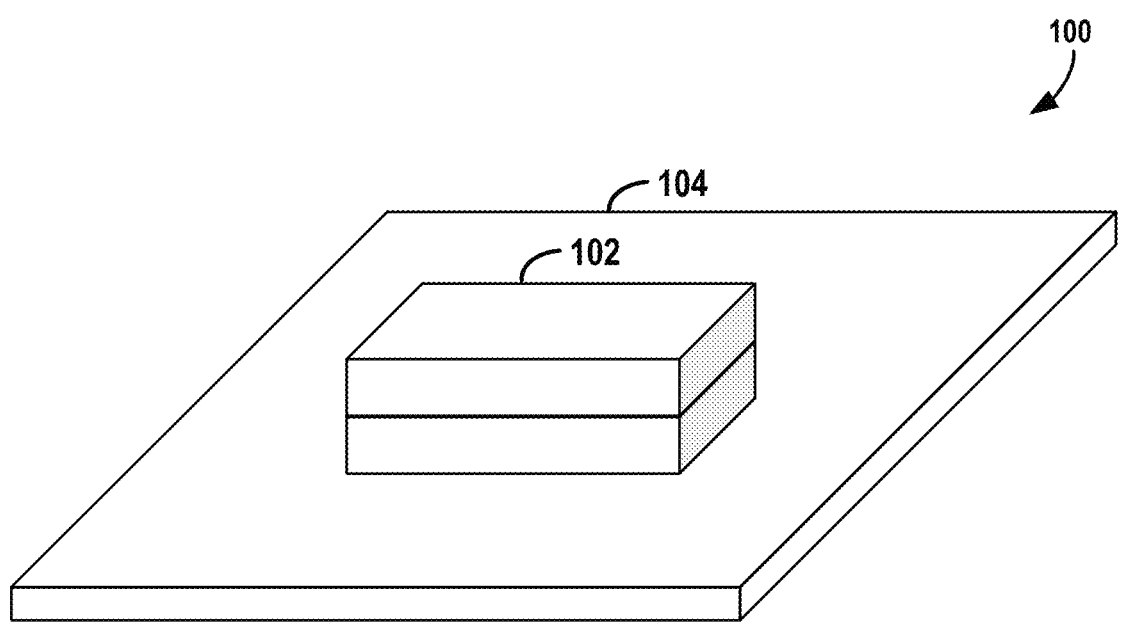
FIG. 1 is a diagram conceptually illustrating an IC testing apparatus according to some aspects of the disclosure.

FIG. 1 is a diagram conceptually illustrating an IC testing apparatus 100 according to some aspects of the disclosure. The IC testing apparatus 100 has an IC socket 102 mounted on a circuit board 104 according to some aspects of the disclosure. An IC device (Device Under Test (DUT)) can be installed inside the IC socket 102 for testing. The IC socket 102 can be configured to accept IC devices in various IC packages, for example, DIP, SO, BGA, etc. Although referred to throughout as an "IC socket," those of skill in the art will recognize that the IC socket 102 can also be called as a burn-in socket, a test socket, or a programming socket. The circuit board 104 can include any suitable circuitry for testing and validating the functions and/or performance of an IC device tested in the IC socket 102. For example, the circuit board 104 can supply power to and provide various input/output signals to/from the IC device tested in the IC socket 102. In some aspects, the IC socket 102 may be used for automated testing of IC devices that are successively loaded into and removed from the IC socket 102. In some aspects, the IC socket 102 and circuit board 104 can provide an electrical interface for connecting the IC device to external testing equipment. Hereafter, an IC device tested using the IC socket 102 can be referred to as a DUT in this disclosure.

Figure 2:
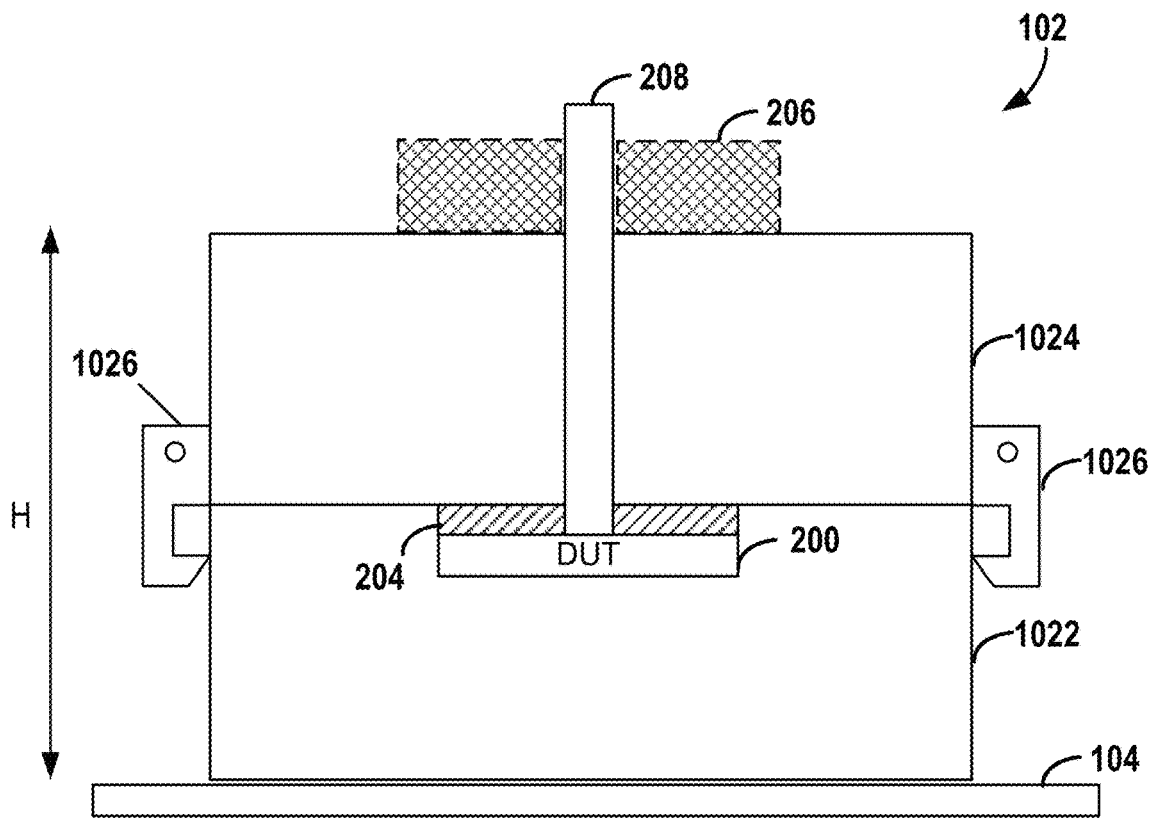
FIG. 2 is a cross-sectional conceptual side view of an IC test socket according to some aspects of the disclosure.

FIG. 2 is a cross-sectional side view for conceptually illustrating a DUT 200 mounted inside the IC socket 102 according to some aspects. The IC socket 102 includes a socket base 1022 (a base member) and a socket cover 1024 (a cover member). The various features and dimensions of the IC socket 102 illustrated in FIG. 2 may not be drawn to scale for the purpose of illustration. The dimensions of the IC socket 102 can depend on the size of the DUT 200 to be tested using the IC socket. In one example, the dimensions of the IC socket 102 are about 18 millimeters (mm) (H)×30 mm (L)×26 mm (W).

The socket cover 1024 can be partially or completely separated from the socket base 1022. In one example, the socket cover 1024 can be secured onto the socket base 1022 by one or more latches 1026 or any suitable fastening mechanisms. For certain IC packages (e.g., BGA), the socket base 1022 can have a space or cavity (e.g., a rectangular recess) configured to receive the DUT 200. The DUT 200 can be surrounded by the socket base 1022 on all four edges to secure the DUT 200 in the IC socket 102 during testing. The socket base 1022 can provide electrical connections (not shown) between the DUT 200 (e.g., one or more electrical pins) and the circuit board 104.

Figure 3:
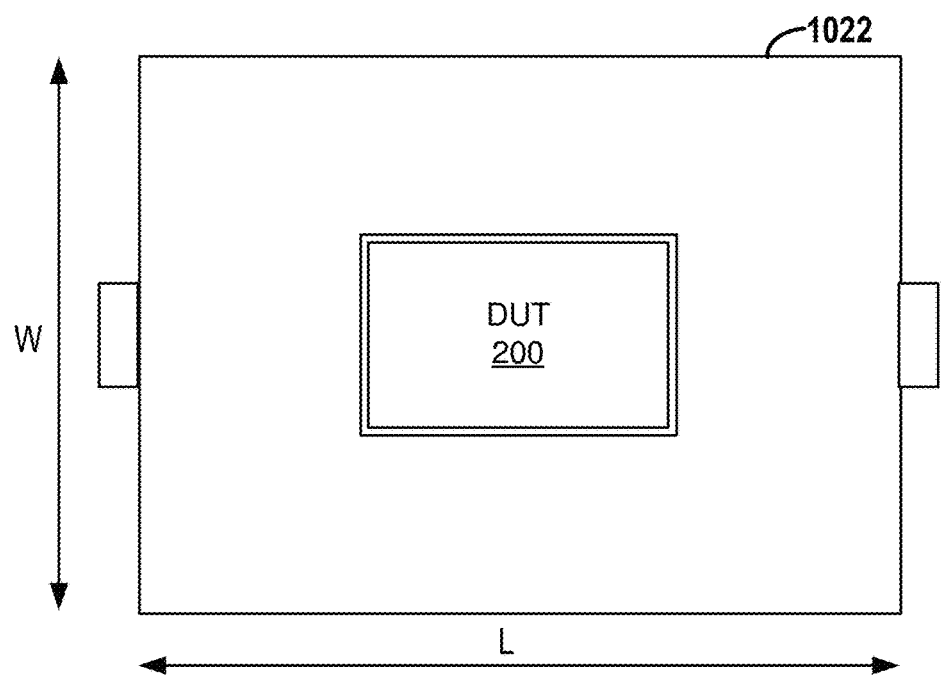
FIG. 3 is a top conceptual view of a socket base of an IC test socket according to some aspects of the disclosure.

FIG. 3 is a top view illustrating the DUT 200 mounted in the socket base 1022. The DUT 200 can be surrounded by the socket base 1022 on all four sides. In this case, there can be a minimum gap or no gap between the DUT 200 and the socket base. Therefore, removing the DUT 200 from the socket base can be difficult without using a tool (e.g., an IC picker) after testing is complete. Thus, testing throughput can be affected when multiple DUTs are tested successively using the same socket.

In some aspects, at least a portion of the socket cover 1024 and/or the socket base 1022 can be made of a material with high thermal conductivity and thermal capacity. For example, the socket cover 1024 can be made of aluminum alloy, copper, etc. In some aspects, the socket cover 1024 may have a thermal interface material (TIM) 204 on a bottom surface facing the DUT. The TIM 204 can make direct contact with the DUT 200 when it is mounted in the socket base 1022. The TIM 204 can be made of a material that can improve the thermal coupling between the socket cover 1024 and the DUT 200 such that more heat energy can be transferred from the DUT to the socket cover to be dissipated by the socket cover. In one example, the TIM 204 can be a silicone-based pad with a thermal conductivity greater than about 3 watts per meter-Kelvin (W/mK). In one example, the TIM 204 may have a thickness between about 1 millimeter (mm) and about 2 mm. In some cases, the DUT 200 can get stuck to the TIM 204 when the socket cover 1024 is separated from the socket base 1022 because the TIM 204 may be made of a material that is sticky or tacky. The socket cover 1024 described below can provide a means to unstick the DUT 200 after testing.

In some aspects, a heat sink 206 can be mounted on the socket cover 1024 to increase the heat transfer from the DUT 200 to the socket cover 1024 such that more heat can be dissipated away from the DUT and socket cover during testing. The heat sink 206 can be made of any suitable material with a high heat capacity and thermal conductivity. Some exemplary heat sink materials include aluminum alloys, copper, etc.

Aspects of the present disclosure involve an IC socket with an IC picking mechanism 208 integrated in the socket cover 1024 of the IC socket 102. In one aspect, the IC picking mechanism 208 can be configured to generate and control suction to retain the DUT 200 against the socket cover 1024 to facilitate easy removal and replacement of the DUT from the IC socket 102 during or following testing. The IC picking mechanism 208 enables a tester (e.g., a test technician) or a robotic arm to remove or replace the DUT 200 without using a separate tool (e.g., a separate IC picker) and/or flipping the socket base 1022 upside down in an attempt to use gravity to remove the DUT. A separate IC picker (not integrated with the IC socket) may not be readily available or sometimes misplaced. When a separate IC picker is not available, a tester may improvise using improper IC removal tools (e.g., screwdrivers, tweezers, pens, pliers, etc.) Even when a separate IC picker is available, it may not be the correct type of IC picker for the specific DUT in the IC socket. The IC socket 102 with the integrated IC picking mechanism 208 can increase the life cycle of the IC socket by avoiding the use of improper IC removal tools that can unintentionally damage the IC socket and/or the DUT. The IC socket with the integrated IC picking mechanism can increase testing throughput by providing a convenient and quick way of removing and replacing the DUT in the IC socket. In some cases, the DUT may be unintentionally pulled out from the socket base because the DUT may stick to the TIM 204 under the socket cover. The IC picking mechanism can be used to ensure that the DUT 200 remains in the socket base 1022 while the socket cover 1024 is separated partially or completely from the socket base.

IC Picking Mechanism Example

Figure 4:
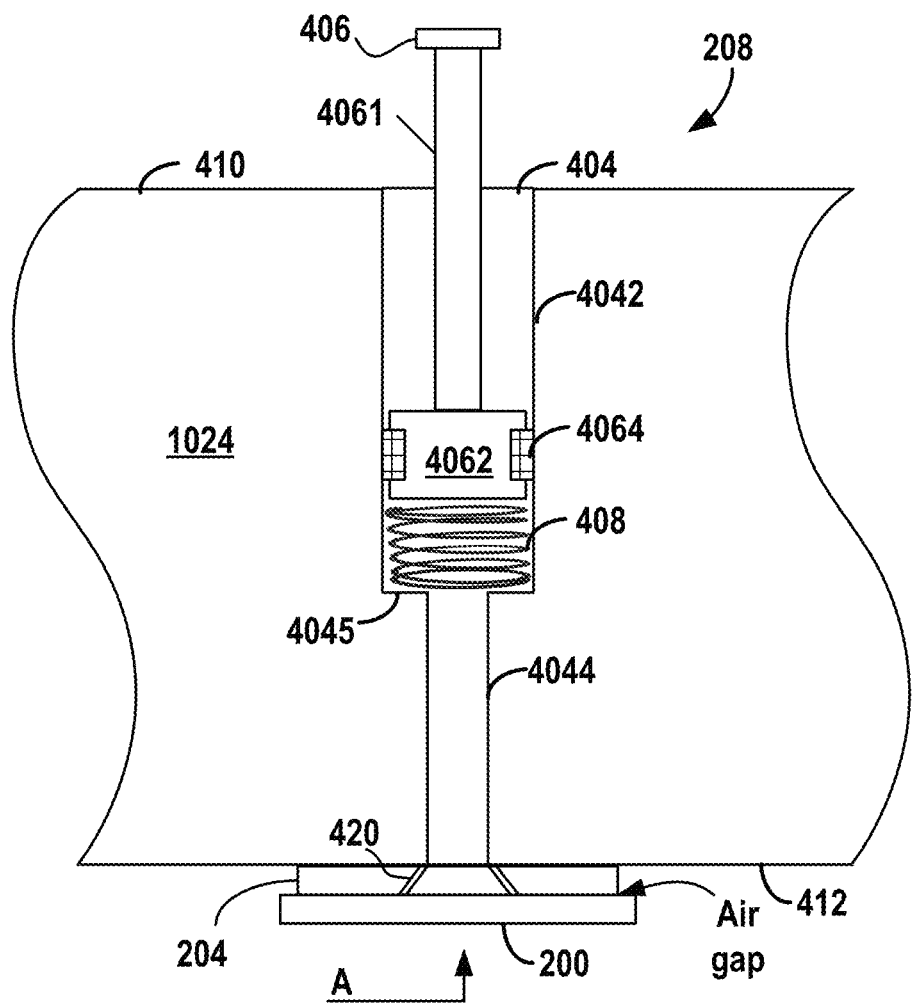
FIG. 4 is a first conceptual cross-sectional side view of a portion of a cover member including an IC picking mechanism according to some aspects of the disclosure.

FIG. 4 is a cross-sectional side view for conceptually illustrating the IC picking mechanism 208 in more detail according to some aspects of the disclosure. The IC picking mechanism 208 is integrally formed or embedded in the socket cover 1024. The various features illustrated in FIG. 4 may not be drawn to scale for the purpose of illustration.

In one aspect, the IC picking mechanism 208 includes a through-aperture 404, a plunger 406, and a resilient member 408 inside the through-aperture. The through-aperture 404 traverses or extends between a first surface 410 (top surface in FIG. 4) and a second surface 412 (bottom surface in FIG. 4) of the socket cover 1024. The second surface 412 faces the DUT 200 and/or the socket base when the socket cover 1024 engages the socket base 1022. The first surface 410 and second surface 412 are on opposite sides of the socket cover 1024, respectively. In one aspect, a thermal interface material (e.g., TIM 204 of FIG. 2) can be installed on the bottom surface of the socket cover 1024 to improve the heat transfer between the DUT 200 and the socket cover 1024. In one aspect and during operation, the IC picking mechanism 208 can be used to reduce an atmospheric pressure inside the through-aperture 404 to generate suction that keeps the DUT 200 attached to the socket cover or TIM 204 (if used). In some aspects, the through-aperture 404 has two portions (e.g., a first chamber 4042 and a second chamber 4044) that may or may not be concentric. The two chambers may have the same or different cross-sectional widths. The two chambers may have the same or different cross-sectional shapes, for example, circular, triangular, rectangular, or polygonal shapes. In one example, the first chamber 4042 and the second chamber 4044 may be cylindrical with different diameters or widths. In one example, the first chamber 4042 can have a larger diameter or width than the second chamber 4044. The first chamber and the second chamber may or may not have the same length. In one example, the first chamber 4042 may be longer than the second chamber 4044 in length. In another example, the first chamber may be shorter than the second chamber in length. In one aspect, a cup member 420 may be provided at an opening of the second chamber 4044 to provide an airtight seal between the second chamber 4044 and the DUT 200. In some aspects, the cup member 420 can be made of a resilient and flexible material, for example, plastic, rubber, silicone, etc. In some aspects, the cup member 420 can be a part of the TIM 204.

Figure 5:
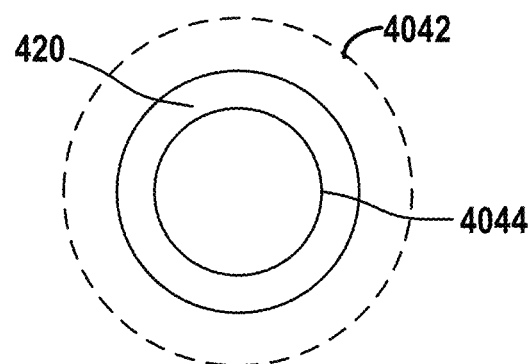
FIG. 5 is a drawing illustrating a cup member of the IC picking mechanism of FIG. 4 according to some aspects of the disclosure.

FIG. 5 is a drawing illustrating a bottom view (denoted as view A in FIG. 4) of the IC picking mechanism 208, showing the cup member 420 as though the DUT 200 were removed from the IC picking mechanism 208. In this case, the cup member 420 has a circular shape. In other embodiments, the cup member 420 can have other suitable shapes, including, for example, triangular, rectangular, polygonal, or other appropriate shapes.

In one aspect, the plunger 406 has a shaft portion 4061 and a piston portion 4062. The shaft portion 4061 and the piston portion 4062 are attached and can be made of a material with sufficient strength for repeated operations. For example, the shaft portion and the piston portion can be made of steel (e.g., stainless steel) or high-temperature plastic material that is stable at least up to an expected operating temperature (e.g., about 125 degrees Celsius (° C.)) of the socket. The piston portion 4062 may have the same or greater width than the shaft portion 4061. In some aspects, the piston portion 4062 can have any suitable cross-sectional shape, including, for example, rectangular, triangular, circular, polygonal, or other suitable shapes. The piston portion 4062 and at least a portion of the shaft portion 4061 are disposed inside the first chamber 4042, and are movable in a length or axial direction of the first chamber 4042. In one example, the shaft portion and the piston portion may have a circular cross-section. The resilient member 408 is positioned between the piston portion 4062 and the second chamber 4044. The resilient member 408 is designed to push back on the plunger when the resilient member 408 is compressed. The resilient member 408 can be made of any suitable compressible material and can have any suitable shape that works to achieve this function. In one example, the resilient member 408 can be a coil spring (e.g., a steel or Music wire spring) or the like that is stable up to the expected operating temperature (e.g., at least 125° C.) of the socket. In one example, the coil spring has a central axis aligned in parallel with a central axis or axial direction of the through-aperture. In another example, the resilient member 408 can have the shape of a hollow column (e.g., made of an elastomer such as silicone or rubber).

Figure 6:
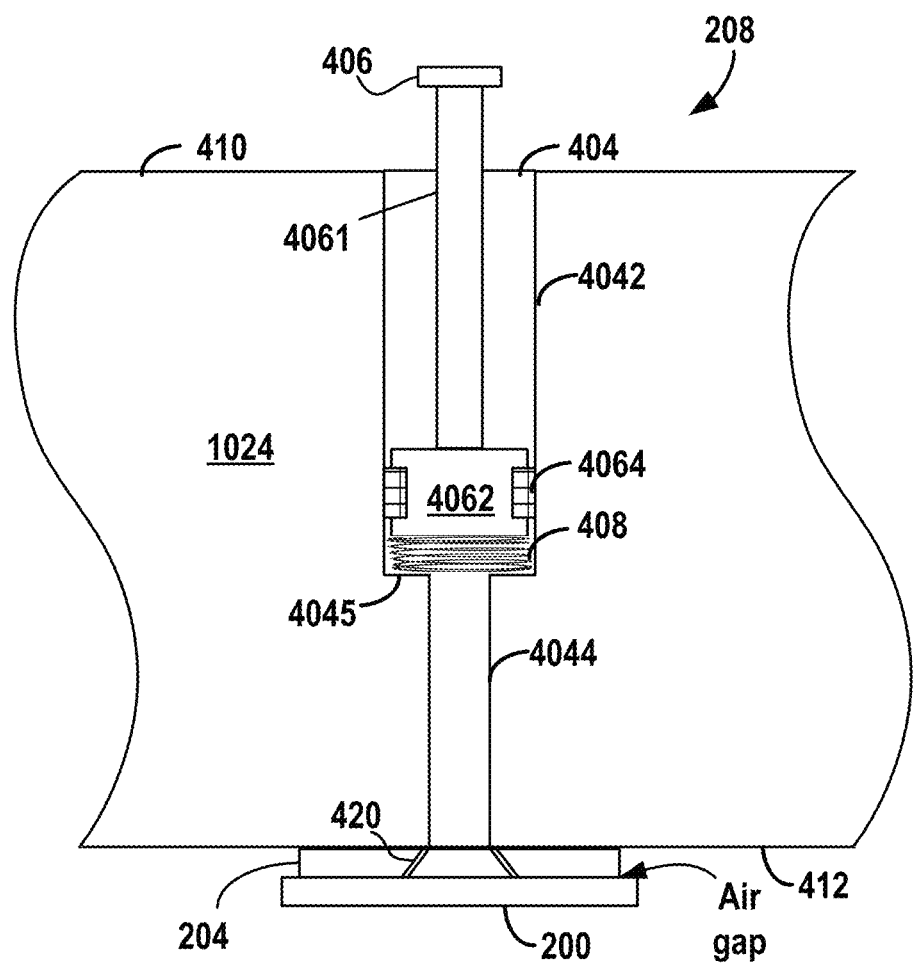
FIG. 6 is a second conceptual cross-sectional side view of a portion of the cover member including the IC picking mechanism of FIG. 4 according to some aspects of the disclosure.

FIG. 6 is a drawing showing the IC picking mechanism 208 in a second position wherein the resilient member 408 is compressed between the piston portion 4062 and an inner wall 4045 that forms an end of the first chamber 4042. When the resilient member 408 is compressed, the resilient member urges or pushes the piston portion 4062 to move away from the second chamber 4044. In contrast, FIG. 4 shows the IC picking mechanism 208 in a first position wherein the resilient member 408 has pushed the piston portion 4062 away and thereby the IC picking mechanism 208 generates a suction force at the cup member 420 that causes the DUT 200 to be retained against the TIM 204, cup member 420 and/or socket cover 1024.

The piston portion 4062 is configured to maintain an airtight seal with the inner wall of the first chamber 4042, while the piston portion 4062 can move inside the first chamber in the length or axial direction of the first chamber. In one example, a gasket 4064 can surround the piston portion 4062 to provide an airtight seal between the piston portion and the inner wall of the first chamber 4042. In one example, the gasket 4064 may be an O-ring seal. The gasket may be made of a material (e.g., polyurethane rubber or silicone) that is stable at the expected operating temperature (e.g., at least 125° C.) of the socket or DUT. The gasket 4064 can be seated in a groove formed around the circumference of the piston portion 4062. The gasket 4064 can be slightly compressed by the inner wall of the first chamber 4042 against the piston portion 4062 to form the airtight seal. In one example, the resilient material 408 can form an airtight seal between the first chamber 4042 and the second chamber 4044 with or without the use of the gasket 4064. In one example, the piston portion 4062 can be made of a resilient or flexible material that can provide an airtight seal without using the gasket 4064. In one example, the piston portion 4062 and the shaft portion 4061 can be separate components that are assembled together to form the plunger 406.

IC Test Socket Operations

An IC socket (e.g., IC socket 102) with the above-described integrated IC picking mechanism 208 can be used to facilitate the testing of an IC device (e.g., DUT 200).

Figure 7:
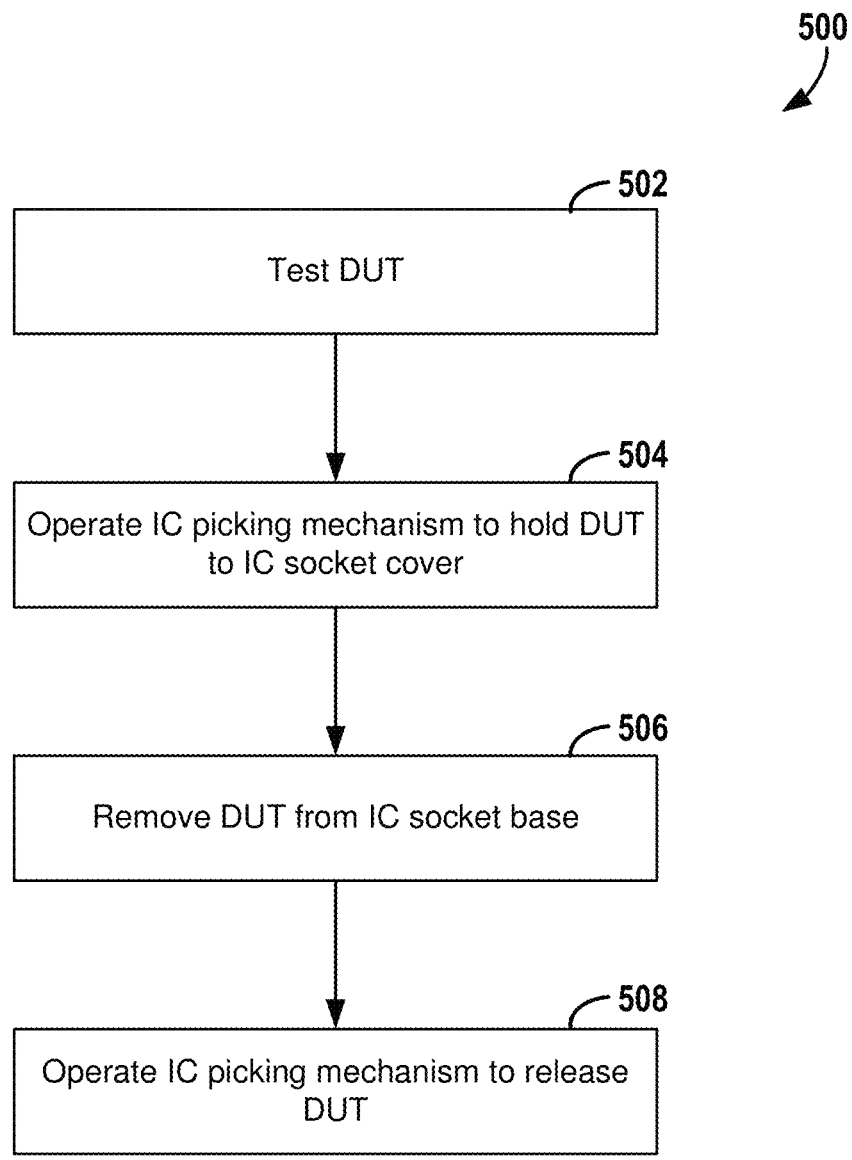
FIG. 7 is a flow chart illustrating a first exemplary method of testing an IC device using an IC test socket according to some aspects of the disclosure.

FIG. 7 is a flow chart illustrating a method 500 of testing a DUT using the IC socket 102 according to some aspects. At 502, a DUT can be tested using the IC socket 102 mounted on the circuit board 104 described above in relation to FIGS. 1-6. For example, the DUT can be tested for electrical performance and/or electrical connections to check for manufacturing defects and performance compliance. The IC socket 102 has a socket cover 1024 that is equipped with the integrally formed IC picking mechanism 208 described above.

At 504, a user (e.g., IC tester) or a robotic arm can operate the IC picking mechanism 208 to hold the DUT to the IC socket cover 1024 by suction. To that end, the plunger 406 can be pushed down (i.e., toward the second chamber 4044) into the first chamber 4042 such that the piston 4062 can push some air out of the through-aperture 404 via the second chamber 4044. The air inside the second chamber is pressurized when the piston 4062 is pushed down the first chamber 4042, and the air can be squeezed out through a gap or air passage between the socket cover 1024 (or TIM 204 if used) and the DUT 200. In some examples, the socket cover can be equipped with the cup member 420 that can temporarily deform to provide the air passage for exhausting the air out of the second chamber 4044. When the plunger 406 is pushed down the first chamber 4042 to exhaust the air, the piston 4062 compresses the resilient member 408 (e.g., a coil spring). When the user or robotic arm releases the plunger 406, the resilient member 408 can expand to push up (i.e., away from the second chamber 4044) the plunger 406/piston 4062 in the first chamber 4042 and generate a lower atmospheric pressure or partial vacuum in the through-aperture 404 (e.g., inside the second chamber 4044) since there is no path for outside air to enter the through-aperture due to the DUT 200 blocking the opening of the second chamber 4044. Therefore, the DUT can be held attached to the bottom side of the socket cover by the suction generated by the low atmospheric pressure or partial vacuum in the through-aperture 404.

At 506, the user or robotic arm can separate the socket cover 1024 from the socket base 1022. For example, the socket cover can be lifted up to separate it from the socket base. At the same time, the lifting of the socket cover can cause the removal of the DUT from the socket base 1022 because the DUT is held to the socket cover by the suction generated by operating the IC picking mechanism 208 described above at block 504. In this case, no separate tool (e.g., a separate IC picker) is used to remove the DUT from the socket base. Further, the user or robotic arm does not need to flip over the test socket to move the DUT.

At 508, the user or robotic arm can operate the IC picking mechanism to release the DUT from the socket cover 1024 after removing the DUT from the socket base 1022. For example, the plunger 406 can be pushed down in the first chamber 4042 to release the DUT from the socket cover. Pushing down the plunger 406 in the first chamber breaks the airtight seal between the socket cover (or TIM if used) and the DUT. As a result, outside air can enter the second chamber 4044 to equalize the air pressure inside the second chamber that generates the suction holding the DUT to the socket cover, and the DUT is released.

Figure 8:
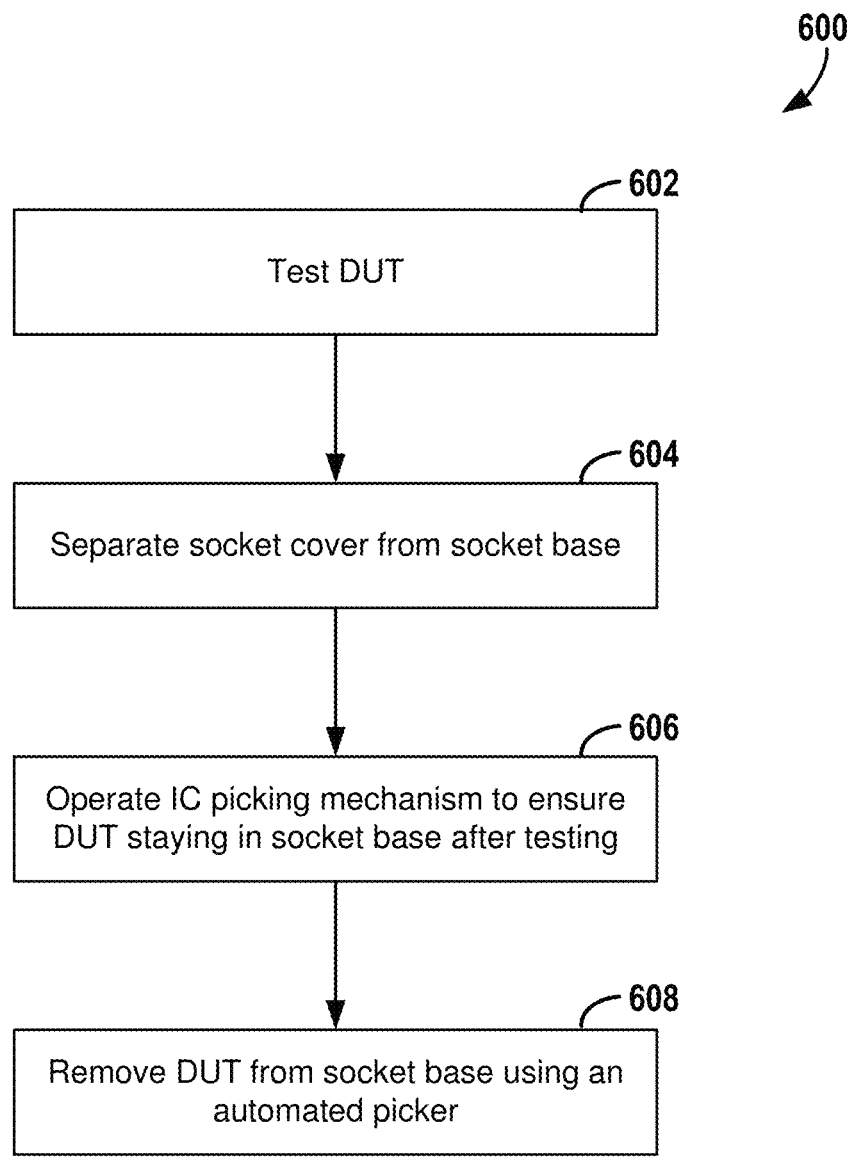
FIG. 8 is a flow chart illustrating a second exemplary method of testing an IC device using an IC test socket according to some aspects of the disclosure.

FIG. 8 is a flow chart illustrating a method 600 of testing a DUT using the IC socket 102 according to some aspects. This method 600 is used to ensure that the DUT stays in the IC socket 102 after testing while the method 500 of FIG. 7 is used to remove the DUT from the IC socket 102 after testing. At 602, a DUT can be tested using the IC socket 102 mounted on the circuit board 104 described above in relation to FIGS. 1-6. The IC socket has a socket cover 1024 with the IC picking mechanism 208 described above. During testing, the DUT can be held in the socket base 1022 by the socket cover 1024.

At 604, the socket cover can be separated from the socket base after testing the DUT in the IC socket. In some examples, a robotic or automation arm can be used to separate the socket cover from the socket base. In some examples, a tester or operator can separate the socket cover from the socket base. In applications where the DUT is removed from the socket base using a robotic arm or an automated IC picker, it is desirable to ensure that the DUT stays in the socket base after the socket cover is separated from the socket base. In some examples, the socket cover may be equipped with a TIM 204 to improve the heat transfer between the socket cover and the DUT. When the TIM 204 is made of sticky or gluey material, the DUT is more likely to be attached to the socket cover when the socket cover is separated from the socket base. When the DUT is unintentionally removed from the socket base (e.g., such as when the DUT is undesirably stuck to the TIM), an automated testing process can be disrupted, for example, when the robotic arm cannot locate the DUT in the socket base.

At 606, the IC picking mechanism 208 can be operated to ensure that the DUT stays in the socket base after testing. For example, a robotic arm can push down the plunger 406 in the first chamber 4042 toward the second chamber 4044 after separating the socket cover from the socket base. Pushing down the plunger 406 can force the air inside the through-aperture 404 (e.g., first chamber 4022 and second chamber 4044) to be exhausted via an air gap or channel between the socket cover 1024 (or TIM 204 if used) and the DUT. The exhausted air can exert a force or air channel on the DUT to dislodge the DUT from the socket cover 1024 or TIM.

At 608, the DUT can be removed from the socket base, for example, using a robotic arm equipped with an automated IC picker. Using the above-described IC picking mechanism 208 integrally formed in the socket cover can ensure that the DUT remains in the socket base after testing. Thus, after testing, the robotic arm can remove the DUT and replace it with another DUT to facilitate automated testing of multiple IC devices successively.

Figure 9:
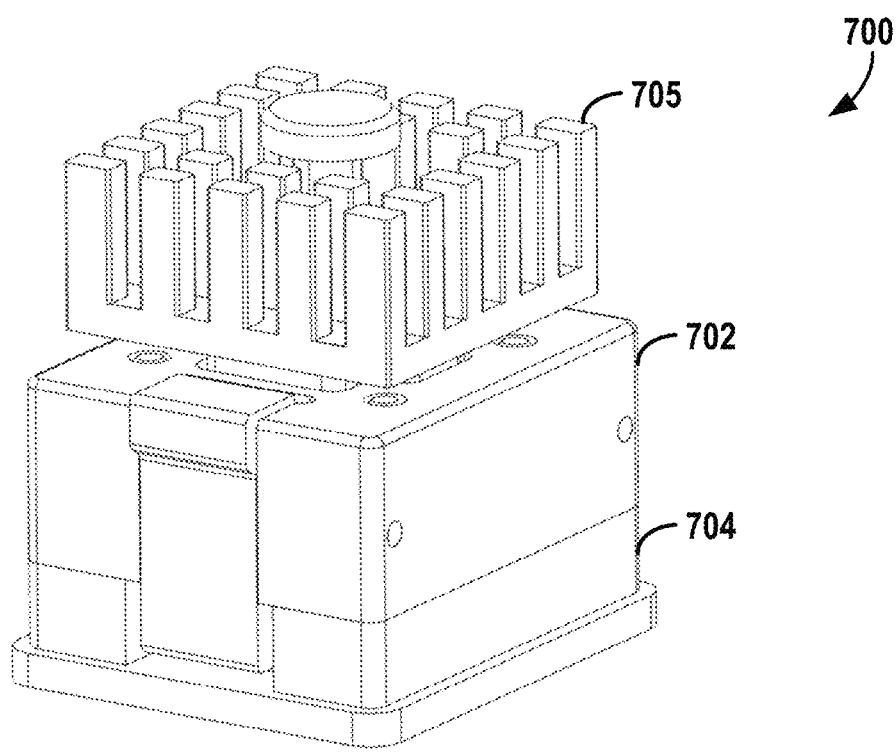
FIGS. 9 and 10 are drawings illustrating different perspective views of an IC test socket according to one embodiment.
Figure 10:
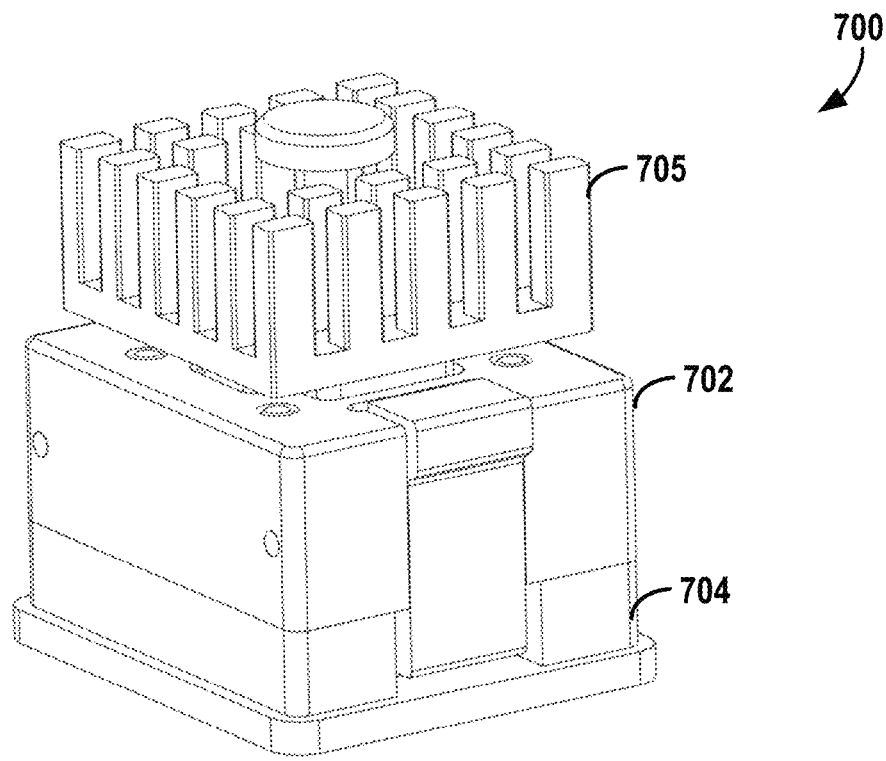

FIGS. 9 and 10 are drawings illustrating different perspective views of an IC test socket 700 according to one embodiment. The IC test socket 700 has a socket cover 702 and a socket base 704 similar to those described above in relation to FIGS. 1-6. In some examples, the socket cover 702 may have a heat sink 705 that can increase the heat transfer of the socket cover to keep the DUT at the expected operating temperature (e.g., consistent with the surrounding environment).

Figure 11:
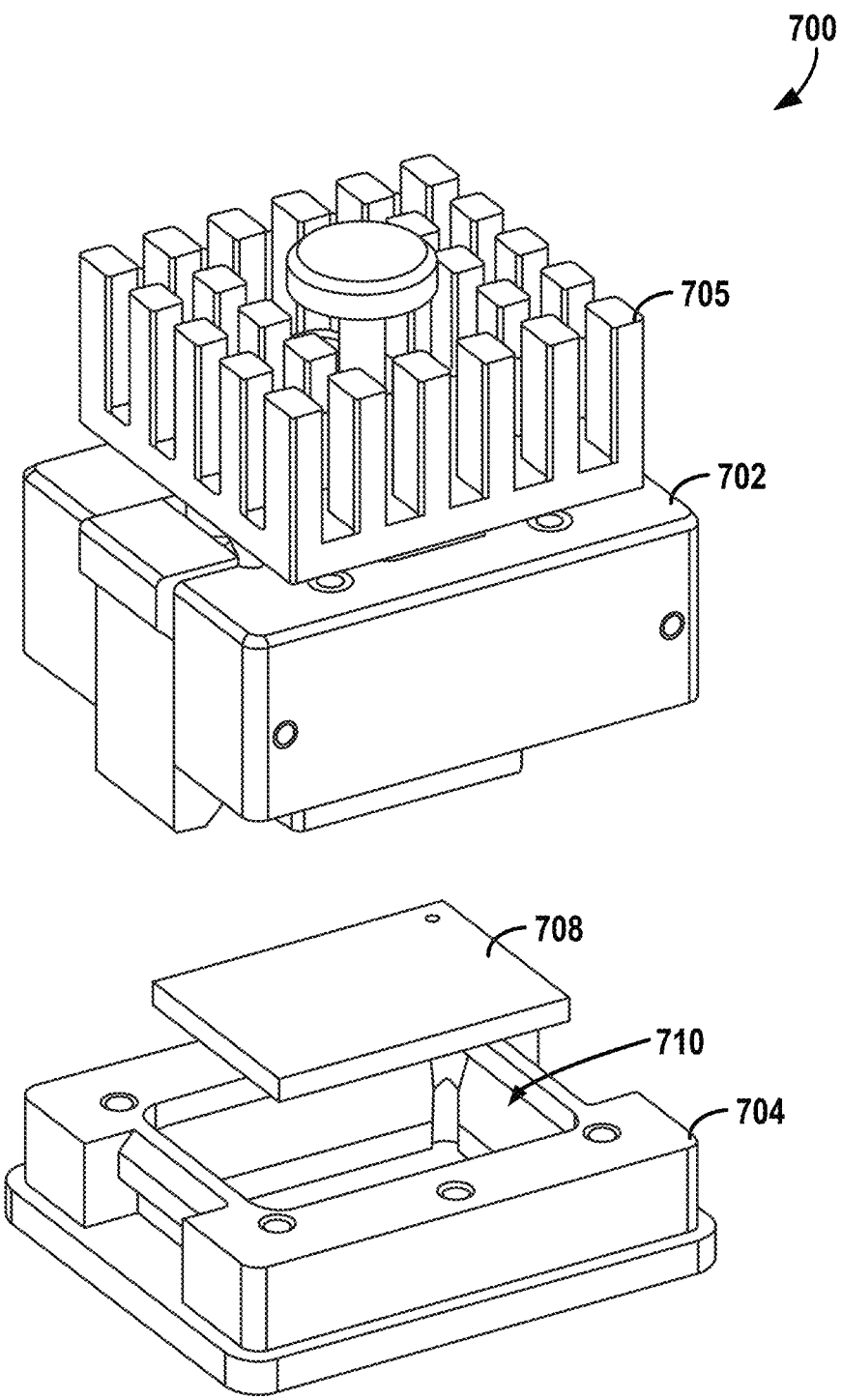
FIG. 11 is a drawing illustrating a partially exploded view of the IC test socket of FIGS. 9 and 10.

FIG. 11 is a drawing illustrating the socket cover 702 separated from the socket base 704. A DUT 708 (e.g., IC device) can be received in a recess 710 of the socket base 704 for testing.

Figure 12:
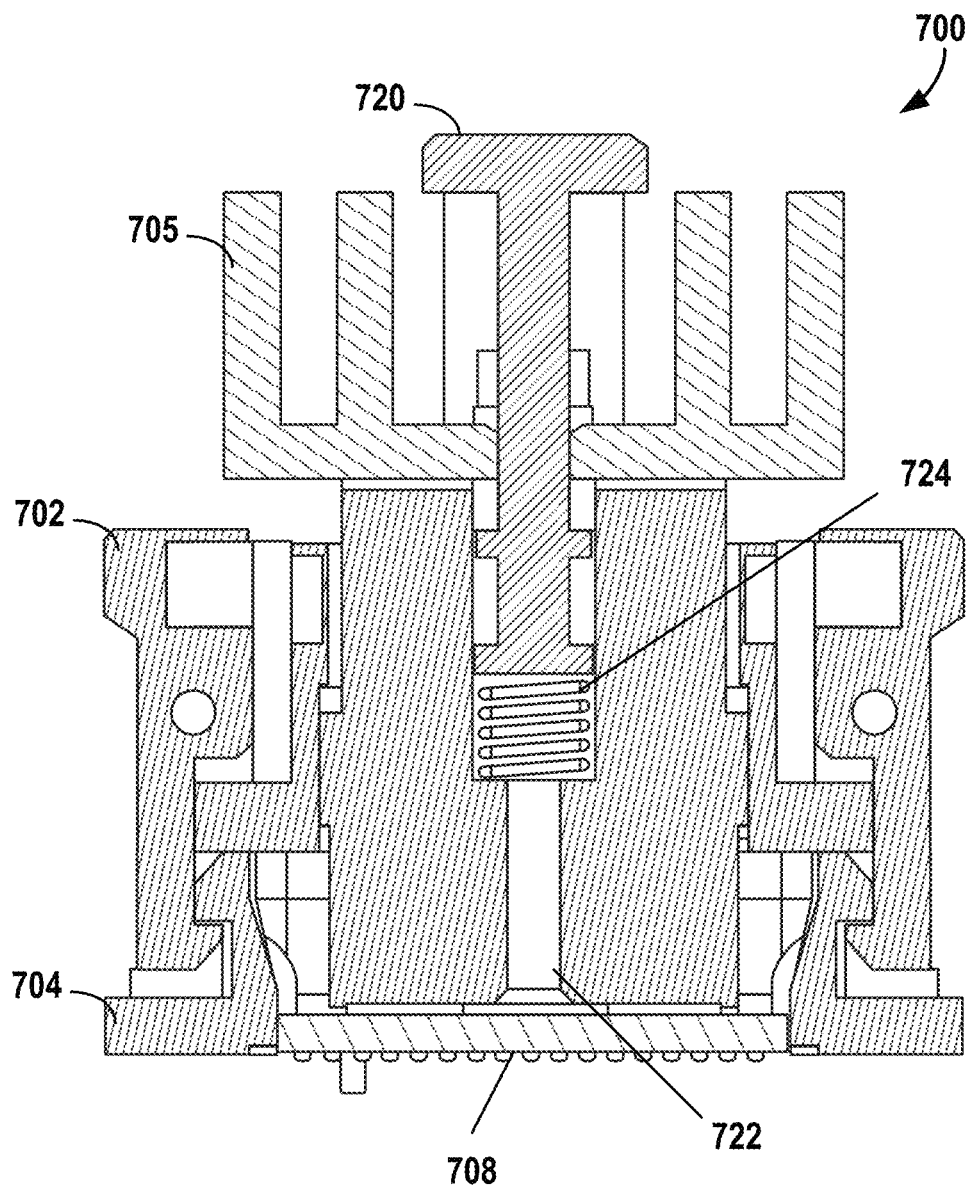
FIG. 12 is a cross-sectional side view of the IC test socket of FIGS. 9 and 10.

FIG. 12 is a cross-sectional side view of the IC socket 700 according to one embodiment. The socket cover 702 has an integrated IC picking mechanism similar to the IC picking mechanism 208 described above. The integrated IC picking mechanism includes a plunger 720 movable inside a through-aperture 722 to generate suction to hold the DUT 708 to socket cover 702. The plunger 720 can also be operated to release the DUT 708 from the socket cover 702. In this example, the IC picking mechanism has a coil spring 724 (a resilient member) that pushes the plunger 720 back up when the plunger is released after being pressed down to exhaust the air inside the through-aperture. In one aspect, the IC test socket 700 and its components as shown in FIGS. 9-12 can be viewed as having been drawn roughly to scale.

The examples set forth herein are provided to illustrate certain concepts of the disclosure. The apparatus, devices, or components illustrated above may be configured to perform one or more of the methods, features, or steps described herein. Those of ordinary skill in the art will comprehend that these are merely illustrative in nature, and other examples may fall within the scope of the disclosure and the appended claims. Based on the teachings herein those skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Aspects of the present disclosure have been described above with reference to schematic flowchart diagrams and/or schematic block diagrams of methods, apparatus, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

The subject matter described herein may be implemented in hardware, software, firmware, or any combination thereof. As such, the terms "function," "module," and the like as used herein may refer to hardware, which may also include software and/or firmware components, for implementing the feature being described. In one example implementation, the subject matter described herein may be implemented using a computer readable medium having stored thereon computer executable instructions that when executed by a computer (e.g., a processor) control the computer to perform the functionality described herein. Examples of computer readable media suitable for implementing the subject matter described herein include non-transitory computer-readable media, such as disk memory devices, chip memory devices, programmable logic devices, and application-specific integrated circuits. In addition, a computer readable medium that implements the subject matter described herein may be located on a single device or computing platform or may be distributed across multiple devices or computing platforms.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner. Tasks or events may be added to or removed from the disclosed example embodiments. The example systems and components described herein may be configured differently than described. For example, elements may be added to, removed from, or rearranged compared to the disclosed example embodiments.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The word "exemplary" is used herein to mean "serving as an example, instance, or illustration." Any aspect described herein as "exemplary" is not necessarily to be construed as preferred or advantageous over other aspects. Likewise, the term "aspects" does not require that all aspects include the discussed feature, advantage or mode of operation.

While the above descriptions contain many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents. Moreover, reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise.

The terminology used herein is for the purpose of describing particular aspects only and is not intended to be limiting of the aspects. As used herein, the singular forms "a," "an" and "the" are intended to include the plural forms as well (i.e., one or more), unless the context clearly indicates otherwise. An enumerated listing of items does not imply that any or all of the items are mutually exclusive and/or mutually inclusive, unless expressly specified otherwise. It will be further understood that the terms "comprises," "comprising," "includes" "including," "having," and variations thereof when used herein mean "including but not limited to" unless expressly specified otherwise. That is, these terms may specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be used there or that the first element must precede the second element in some manner. Also, unless stated otherwise a set of elements may include one or more elements. In addition, terminology of the form "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As a further example, "at least one of: A, B, or C" is intended to cover A, B, C, A-B, A-C, B-C, and A-B-C, as well as multiples of the same members (e.g., any lists that include AA, BB, or CC). Likewise, "at least one of: A, B, and C" is intended to cover A, B, C, A-B, A-C, B-C, and A-B-C, as well as multiples of the same members. Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

What is claimed is:

1. An integrated circuit test socket comprising:
   a base member comprising a recess configured to receive an integrated circuit (IC) device for testing; and
   a cover member configured to removably engage the base member to secure the IC device between the cover member and the base member, the cover member comprising an IC picking mechanism integrally formed in the cover member, the IC picking mechanism comprising a movable plunger that is movable inside a through-aperture of the cover member and configured to:
      generate, responsive to a movement of the movable plunger away from the IC device, a suction to retain the IC device to the cover member, and
      release, responsive to a movement of the movable plunger toward the IC device, the IC device from the cover member,
      wherein the movable plunger is configured to be operated manually; and
      wherein the cover member comprises one or more latches configured to secure the cover member to the base member.

2. The integrated circuit test socket of claim 1, wherein the movable plunger is movable between a first position and a second position along an axial direction of the through-aperture to change an air pressure inside the through-aperture for controlling the suction.

3. The integrated circuit test socket of claim 2, wherein the cover member further comprises:
   a resilient member located inside the through-aperture and adjacent to the movable plunger, resilient member configured to be compressed by the movable plunger in the second position.

4. The integrated circuit test socket of claim 3, wherein the resilient member comprises either of a coil spring or an elastomeric hollow column, each comprising a central axis aligned in parallel with a central axis of the through-aperture.

5. The integrated circuit test socket of claim 3, wherein:
   the through-aperture has a first chamber and a second chamber;
   at least a portion of the movable plunger is movable between the first position and the second position in the first chamber; and
   the resilient member is located at an end of the first chamber and between the movable plunger and the second chamber.

6. The integrated circuit test socket of claim 5, wherein the first chamber and the second chamber comprise at least one of:
   a different width measured in a direction substantially parallel to a top surface of the IC device; or
   a different cross-sectional shape taken across a plane substantially parallel to the top surface of the IC device.

7. The integrated circuit test socket of claim 1, wherein the through-aperture extends between a first surface of the cover member and a second surface of the cover member, the second surface facing the base member.

8. The integrated circuit test socket of claim 7, wherein the through-aperture has a first opening on the first surface of the cover member and a second opening on the second surface of the cover member, the first opening being larger than the second opening in width.

9. The integrated circuit test socket of claim 8, wherein the cover member further comprises:
   a cup member extending from the second opening, the cup member configured to form an airtight seal with the IC device.

10. The integrated circuit test socket of claim 1, further comprising:
    a heatsink on a first surface of the cover member, wherein at least a portion of the movable plunger passes through an opening of the heatsink; and
    a thermal interface material (TIM) on a second surface of the cover member, the first surface and the second surface being on opposite sides of the cover member.

11. The integrated circuit test socket of claim 1, wherein the movable plunger comprises:
    a shaft portion; and
    a piston portion attached to the shaft portion and configured to form an airtight seal with an inner wall of the through-aperture.

12. The integrated circuit test socket of claim 1, wherein the movable plunger is configured to:
    generate the suction in response to the movable plunger at a first position; and
    release the IC device in response to the movable plunger at a second position,
    wherein the movable plunger is closer to the IC device at the second position than at the first position.

13. The integrated circuit test socket of claim 1, wherein the cover member is configured to enable a user to remove the IC device from the base member without using a separate tool.

14. An integrated circuit test socket comprising:
- a base member for holding an integrated circuit (IC) device to be tested therein; and
- a cover member configured to removably engage the base member to secure the IC device between the cover member and the base member, the cover member comprising:
  - a through-aperture formed between a first surface of the cover member and a second surface of the cover member; and
  - a plunger movable in the through-aperture to change an atmospheric pressure inside the through-aperture to control a suction that retains the IC device to the cover member,
  - wherein the plunger is configured to be operated manually; and
  - wherein the cover member comprises one or more latches configured to secure the cover member to the base member.

* * * * *